United States Patent
Kagaya

(10) Patent No.: US 8,701,275 B2
(45) Date of Patent: Apr. 22, 2014

(54) SURFACE MOUNTING APPARATUS

(75) Inventor: Hiroyuki Kagaya, Tokyo (JP)

(73) Assignee: Juki Corporation, Chofu-shi, Tokyo (JP)

( * ) Notice: Subject to any disclaimer, the term of this patent is extended or adjusted under 35 U.S.C. 154(b) by 830 days.

(21) Appl. No.: 12/470,105

(22) Filed: May 21, 2009

(65) Prior Publication Data

US 2009/0288292 A1 Nov. 26, 2009

(30) Foreign Application Priority Data

May 22, 2008 (JP) ................. 2008-134245

(51) Int. Cl.
*H05K 13/08* (2006.01)
(52) U.S. Cl.
USPC .................. 29/721; 29/740; 29/833
(58) Field of Classification Search
USPC ........... 29/739–743, 832–834, 705, 719–721; 250/208.1, 559.34; 356/396, 602
See application file for complete search history.

(56) References Cited

U.S. PATENT DOCUMENTS

| | | | | |
|---|---|---|---|---|
| 5,749,142 A * | 5/1998 | Hanamura | ...... | 29/833 |
| 6,538,244 B1 * | 3/2003 | Skunes | ...... | 250/208.1 |
| 6,606,788 B1 * | 8/2003 | Morimoto et al. | ...... | 29/832 |
| 7,559,134 B2 * | 7/2009 | Gaida | ...... | 29/720 |
| 2008/0014772 A1 * | 1/2008 | Ogura et al. | ...... | 439/83 |
| 2009/0288292 A1 * | 11/2009 | Kagaya | ...... | 29/739 |

FOREIGN PATENT DOCUMENTS

| | | | |
|---|---|---|---|
| JP | 8-236995 | * | 9/1996 |
| JP | 3129134 | | 11/2000 |

* cited by examiner

*Primary Examiner* — Minh Trinh
(74) *Attorney, Agent, or Firm* — Drinker Biddle & Reath LLP

(57) ABSTRACT

A surface mounting apparatus includes a mounting head which is movable in X and Y directions and which mounts an electronic component on a positioned board, and a board recognizing camera is fixed to a base and which moves integrally with the mounting head. A correction jig includes a correction mark which is imaged by the board recognizing camera, and an imaging result is used to correct temporal change in an interior portion of the camera including an optical system, and is fixed to the base.

3 Claims, 9 Drawing Sheets

SURFACE MOUNTING APPARATUS

FIELD OF THE INVENTION

The present invention relates to a surface mounting apparatus suitable for improving a correcting accuracy of a board recognizing camera which images a board mark to correct the fixing position where an electronic component is mounted on a board.

DESCRIPTION OF RELATED ART

Usually, as illustrated in FIG. 1, an electronic component mounting apparatus 1 comprises a component supply portion 3 retaining a component to be mounted, a mounting head 10 including a sucking nozzle 10A for sucking the component, and an X-axis direction moving mechanism 12 and a Y-axis direction moving mechanism 14, which move the mounting head 10 in an X-direction and a Y-direction, respectively. A board S is moved on a board transport path 2 extending along one direction to position the board S. Subsequently, the mounting head 10 is moved to a predetermined position on the positioned board S. Then, the electronic component held by the mounting head 10 is mounted at the predetermined position.

The X-axis direction moving mechanism 12 moves the mounting head 10 in the X-axis direction. The Y-axis direction moving mechanism 14 moves the X-axis direction mechanism 12 and the mounting head 10 in the Y-axis direction. The mounting head 10 comprises a Z-axis direction moving mechanism allowing the sucking nozzle 10A ascend and descend in a Z-axis direction, and a θ-axis rotating mechanism rotating the sucking nozzle 10A around a nozzle axis (or suction axis). A board recognizing camera 16 picking up an image of a board mark formed on the board S is attached to the mounting head 10. A component recognizing camera (or imaging means) 18 picking up an image of a component held by the sucking nozzle 10A is arranged on a side of the component supply portion 3. The component recognizing camera 18 picks up the image from below.

Currently, in the aforementioned electronic component mounting apparatus, the structural limits to both reliability and accuracy of drive mechanisms, such as the X-axis direction drive mechanism 12 and the Y-axis direction drive mechanism 14, and of the position detecting device, such as an encoder, for detecting a moving position have been reached, and sufficient accuracy of mounting an electronic component has been achieved.

Accordingly, from now on, it is important how such high accuracy of mounting an electric component can be stabilized and maintained. Thus, it is necessary that correction of temporal changes in reliability and accuracy is always and accurately performed.

In a related art, in order to deal with the aforementioned temporal change of the accuracy of mounting an electronic component, the fixing position of each mounting board is corrected using the board recognizing camera. However, there is a problem that the board recognizing camera itself undergoes temporal change.

Thus, as illustrated in FIGS. 2 and 3, the board recognizing camera 16 supported together with the mounting head 10 on a base 20 movably attached to the X-axis direction moving mechanism 12 is moved over a position correcting unit 22 fixedly disposed on the base of the main unit, before the board is mounted. Subsequently, a hole 22A provided in the position correcting unit 22 is imaged by the board recognizing camera 16. The fixing position of the board S is corrected by image recognition using the position of the image of the hole 22A as a reference.

For example, Japanese Patent No. 3129134 discloses, as illustrated in FIG. 8, a method of providing a mark unit in which a mark 18 is put on a plate 34 and in which the mark is recognized by horizontally taking the plate 34 in and out as necessary, and then, as illustrated in a flowchart in FIG. 9, measuring the difference between the positions of the nozzle and the origin point of the mounting head to obtain a correction value.

However, change with time in the condition of the assembly and the components occurs in the board recognizing camera 16 of the position correcting unit 22, which includes an image pickup device, such as a charge-coupled device (CCD) chip incorporated in the board recognizing camera 16, and an optical system, such as lenses, provided in a front end portion of the camera 16. Thus, even in a case where the mechanical mounting position of the camera is not changed, the result of imaging the mark may change. Accordingly, the method of the related art has the problem that a correction cannot be accurate because the result of imaging is inevitably influenced by temporal change in the interior of the camera including the optical system.

The technique disclosed in the Japanese Patent No. 3129134 is intended to correct for the change caused by temperature in a mechanical portion of the camera. Thus, the change in the interior of the camera cannot be determined by this technique. Consequently, the technique disclosed in the Japanese Patent No. 3129134 has a similar problem.

SUMMARY OF INVENTION

The invention provides a surface mounting apparatus capable of easily and accurately correcting for temporal change in the optical system within the board recognizing camera 16 configured to move integrally with the mounting head 10.

According to a first aspect of the invention, a surface mounting apparatus is provided with: a mounting head which is movable in X and Y directions and which mounts an electronic component on a positioned board; and a board recognizing camera which is fixed at the base with the mounting head so that the two move integrally. A correction jig including a correction mark which is imaged by the board recognizing camera to correct temporal change in an interior of the camera including the optical system is fixed to the base.

According to a second aspect of the invention, the correction jig is configured so that the correction mark is movable between a correction position located within an imaging range of the board recognizing camera, and a standby position located out of the imaging range. At that time, it is effective to set a height of the correction position to be the same as a height of a board mark provided on the board for positioning and fixing when an electronic component is to be mounted on the board.

DETAILED DESCRIPTION OF EXEMPLARY EMBODIMENTS

Hereinafter, an embodiment of the invention is described in detail with reference to FIGS. 1 to 7.

Figure 1:
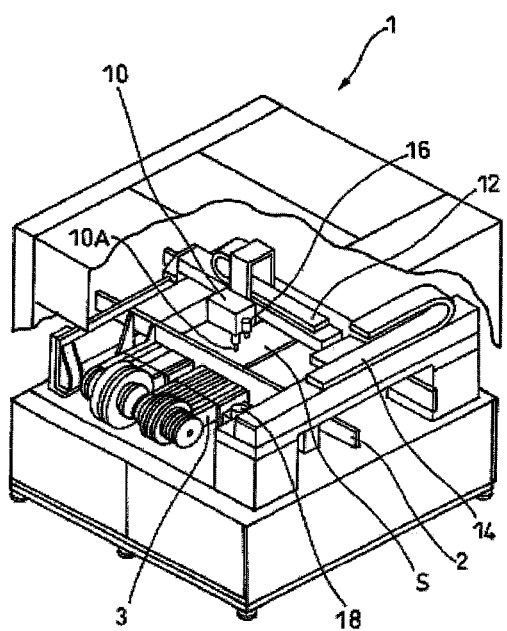
FIG. 1 is a schematic perspective view illustrating an entire surface mounting apparatus.
Figure 2:
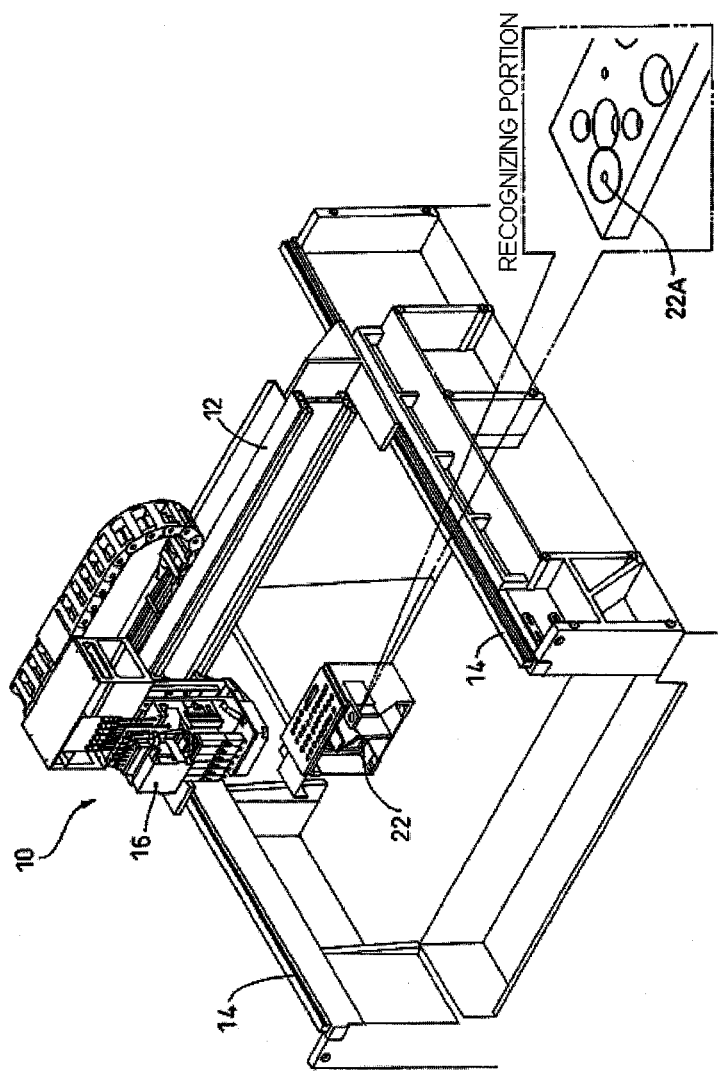
FIG. 2 is an enlarged perspective view of a primary part of the surface mounting apparatus.
Figure 3:
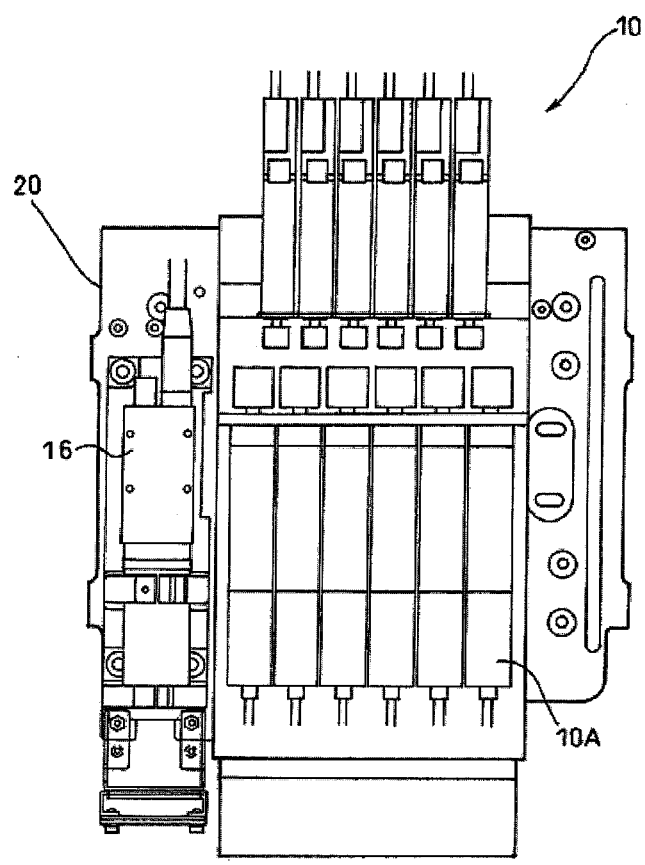
FIG. 3 is an enlarged front view of a mounting head and a board recognizing camera provided in the surface mounting apparatus.
Figure 4:
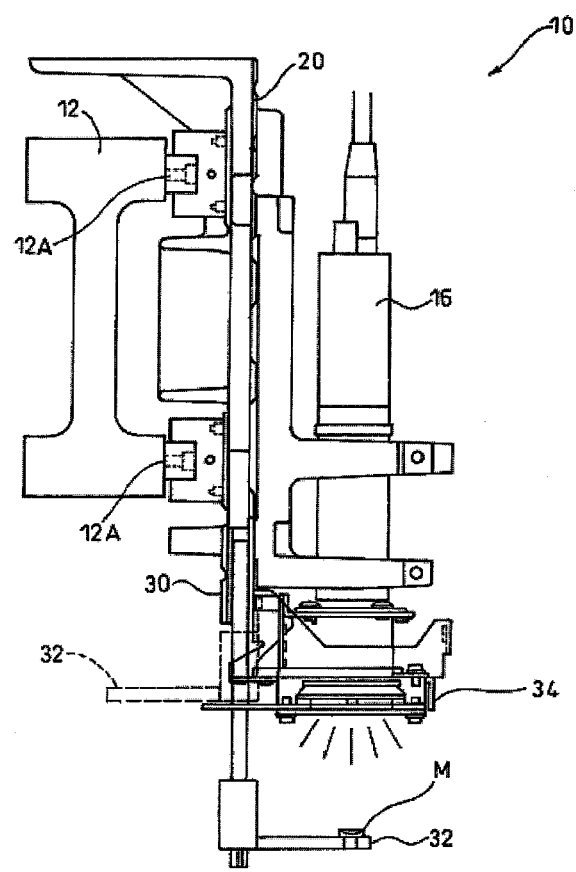
FIG. 4 is a side view illustrating the mounting head, which is a feature of one embodiment according to the invention, and the vicinity thereof.

FIG. 4 is a left side view of a mounting head 10 shown in FIG. 3. Incidentally, a fundamental configuration of a surface mounting apparatus according to the present embodiment is the same as the configuration illustrated in FIGS. 1 to 3. Thus, each component of the present embodiment which is unchanged is designated with the same reference numeral. Consequently, the detailed description of the fundamental configuration is omitted.

A base 20 to which the mounting head 10 is attached is supported by a guide 12A of a X-axis direction drive mechanism 12 so as to be movable in the X-direction which is perpendicular to the plane of a paper. A board recognizing camera 16 is also fixed to the base 20, so that the board recognizing camera 16 can move integrally with the mounting head 10.

According to the present embodiment, a bar-like correction jig 32 extending horizontally is fixed to the base 20 to which the board recognizing camera 16 is fixed, via a connection member 30 which is movable up and down in a Z-axis direction and rotatable around an axis by a drive mechanism (not shown). For example, a ceramic correction mark M is affixed to a front end portion of the correction jig 32, and an illuminating device 34 is arranged above the correction mark M located on an illustrated imaging position.

An illustrated correction position (imaging position) intersects a designed optical axis of the board recognizing camera 16 and is substantially the same height as a positioned board mark (not shown) provided on a board S. The correction jig 32 moves the correction mark M serving as a correction reference between the correction position (imaging position) and a standby position represented with dashed lines, to which the mark M is lifted by being rotated 180 degrees, when there is up-and-down motion and rotation motion of the connection member 30.

Figure 5:
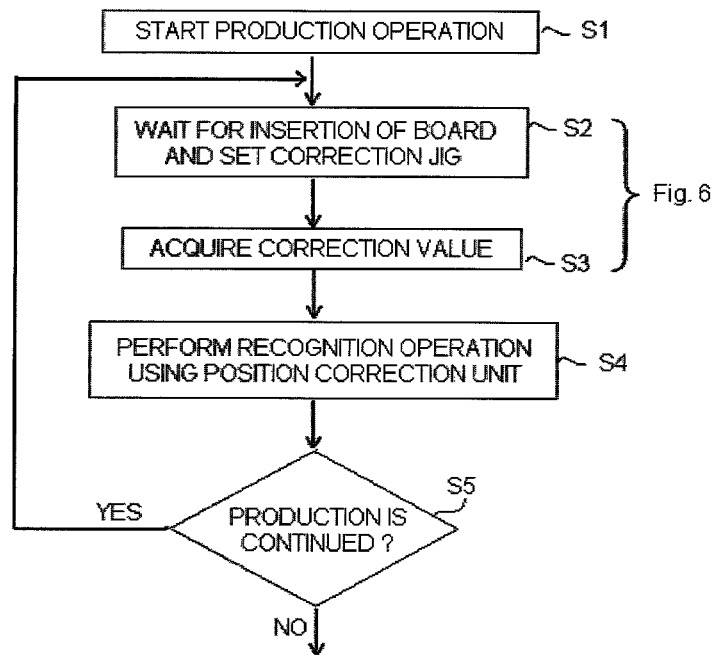
FIG. 5 is a flowchart illustrating an operation of the embodiment of the invention.

Next, an operation of the present embodiment is described below with reference to flowcharts respectively illustrated in FIGS. 5 and 6.

In step S1, a production operation is started. In step S2, while waiting for installation of a board, the correction jig 32 is set so that the position of the correction mark M is in agreement with the correction position illustrated in FIG. 4. In step S3, an image of the correction mark M is picked up by the board recognizing camera 16, and a correction value is obtained.

Subsequently, in step S4, a correction of temporal change of the interior, such as a CCD chip, of the camera is performed, and then, a recognition operation using a position correction unit 22 illustrated in FIG. 2 is performed, similarly to the related art. In step S5, as long as a production operation is continued, processing to be performed in steps S2 to S4 is repeatedly performed.

Figure 6:
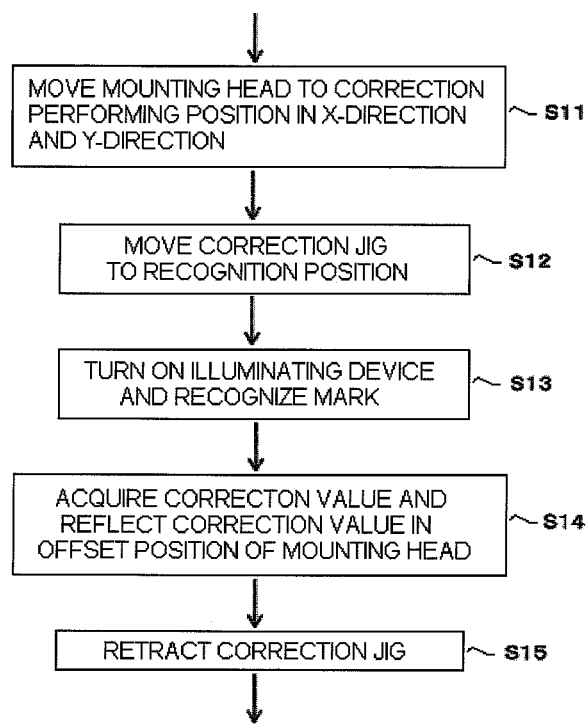
FIG. 6 is a flowchart illustrating in detail a part of the operation of the embodiment of the invention.

FIG. 6 illustrates in detail a part of the operation up to an acquisition of the correction value in the step S3. The operation is performed in a short time, while waiting for a next board S to be inserted and positioned.

First, in step S11, the mounting head 10 is moved in the X and Y directions to a correction performing position at which the mounting head 10 does not interfere with the board S which is to be positioned. Subsequently, in step S12, the correction jig 32 is moved to a recognition position (i.e., the correction position represented by solid lines in FIG. 4) at which the height of the correction mark M is the same as that of the board mark (not shown) provided on the board S. Then, in step S13, an illuminating device 34 is turned on. The correction mark M is imaged and recognized. Next, in step S14, a correction value is acquired from the result of the recognition of the image of the correction mark M. Then, a correction is performed reflecting an offset amount of the mounting head 10. Subsequently, in step S15, the correction jig 32 is retracted to the position represented by dashed lines. Then, the recognition operation in step S4 is performed, similarly to the related art.

Figure 7:
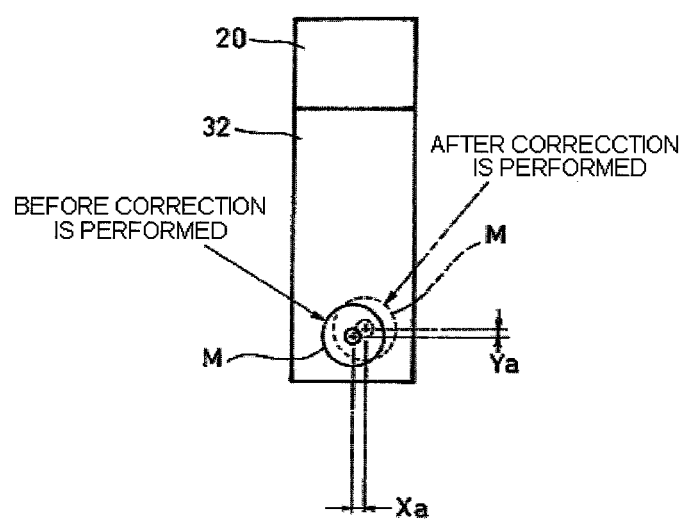
FIG. 7 is an explanatory diagram illustrating a correction method.
Figure 8:
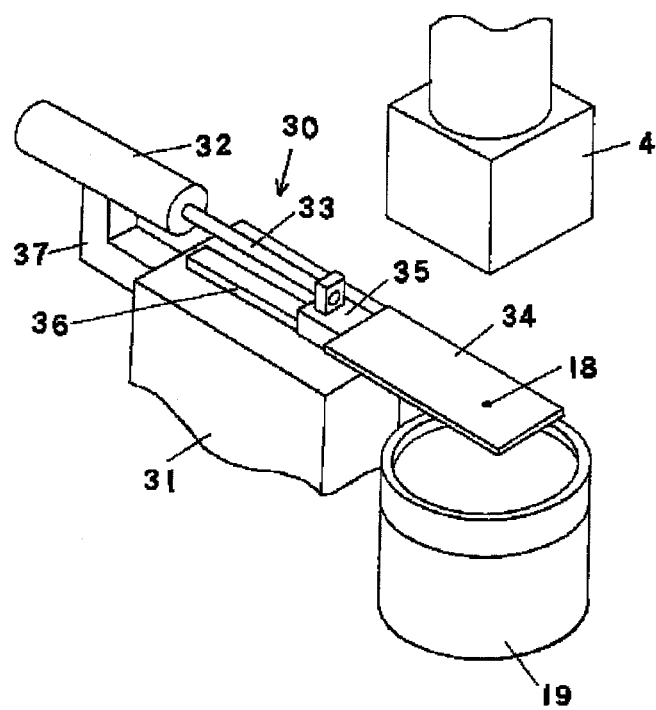
FIG. 8 is a perspective view illustrating a primary part used for correction according to a related art.
Figure 9:
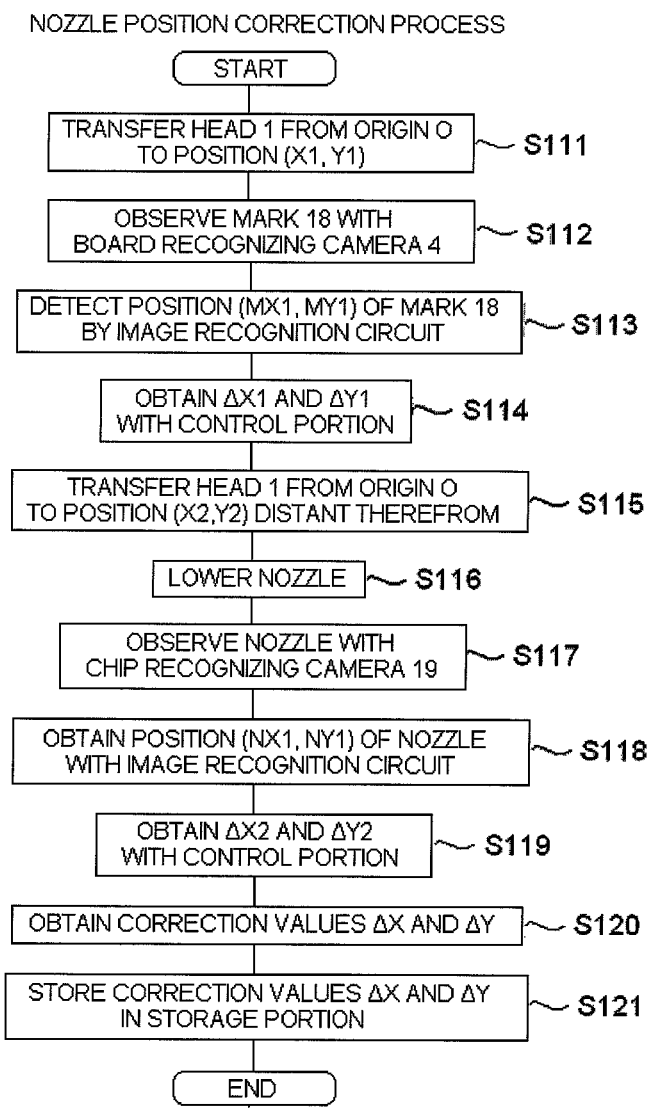
FIG. 9 is a flowchart illustrating a correction method according to the related art.

Correction processing to be performed will be described by using a result of the imaging of the correction mark M as shown in a frame format of FIG. 7. As illustrated in FIG. 7, Xa and Ya are respectively the difference in the X-direction and that in the Y-direction between the solid line position of the mark, whose image is picked up before the correction is performed, and the dashed line position shows the mark after the correction is performed, which is imaged in step S4 for further correction.

The position of the mark before the correction is performed corresponds to a correction value of 0 in a case where the correction is performed for the first time, or to the correction value of the previous correction in the case where the correction has been performed a plurality of times. Thus, the recognized position obtained by the aforementioned operation just before the board is produced is the position of the mark which was imaged after the correction is performed. The differences Xa and Ya between the position of the mark imaged before the correction and the position of the mark imaged after the correction are calculated and set as the amount of change to be carried out in the imaging position by the board recognizing camera 16.

The position correcting unit 22 is recognized with a reciprocal number added to the head offset value for correcting the discrepancy between the positions of the board recognizing camera 16 and the axis of the head. The reciprocal number means the number which will cancel out the amount of change.

The correction according to the related art intended only to recognize the position correcting unit 22 is performed without distinguishing (or considering) temporal change in the interior of the board recognizing camera 16. Assuming that the mark is imaged in a state in which the temporal change in the X and Y axis direction drive mechanisms 12 and 14 is +1 in the X-direction, and in which the temporal change in the interior portion of the board recognizing camera 16 attached to the support via the drive mechanisms 12 and 14 is −1 in the X-direction, the two temporal changes necessarily cancel out to 0. Thus, no temporal change in the position of either the X or the Y axis direction drive mechanism 12 or 14 can be recognized.

On the other hand, according to the present embodiment, even in a case where the temporal change is −1 in the X-direction, it is unnecessary to move the board recognizing camera 16 via the X and Y axis direction drive mechanisms 12 and 14. In addition, due to independently recognize the correction mark M provided on the correction jig 32 fixed to the same base 20, the temporal changes in the positions of the X and Y direction drive mechanisms are recognized similarly to the related art. Accordingly, it can be accurately recognized that the temporal change in the position of the X and Y direction drive mechanisms is +1 in the X-direction, and the temporal change can accurately be corrected.

According to the present embodiment described in detail in the foregoing description, an imaging result from temporal change in the interior of the camera including the optical system can be corrected by recognizing the position of an image of the correction mark M recognized by the board recognizing camera 16. The correction mark M is provided on the correction jig 32 attached to the base 20 to which the board recognizing camera 16 is also attached.

Since the correction jig 32 is attached to the same base 20 to which the board recognizing camera 16 is attached, mechanical error in the positioning between the board recognizing camera 16 and the correction jig 32 can be reduced to an extremely small value. Thus, the imaging result due to a desired temporal change can be kept from being affected by other parts of the apparatus. Consequently, a stable result can be obtained.

The correction jig 32 is arranged such that the correction mark M always intersects the optical axis disposed on the lower side of the board recognizing camera 16. Accordingly, even when the mounting head 10 is placed at a random position, the correction can be performed.

In addition, the correction jig 32 can be disposed at the focal position (at the height of the board mark) of the board recognizing camera 16. The correction jig 32 is configured to be retractable to the standby position when the correction operation is not performed. Thus, the correction jig 32 does not hinder the production operation. Additionally, a compact correction jig can be attached to the correction/recognition position.

In addition, the correction operation can be performed concurrently with the board transporting operation. Thus, even in the case of performing correction with the production of each board, the production tact time is not affected.

What is claimed is:

1. A surface mounting apparatus comprising:
a mounting head which is movable in X and Y directions and which mounts an electronic component on a positioned board; and
a board recognizing camera which is fixed to a base and which moves integrally with said mounting head, wherein
a correction jig is fixed to said base, the correction jig includes a correction mark which is imaged by said board recognizing camera, and an imaging result is used to correct temporal change in an interior portion of said camera including an optical system,
said correction jig is fixed to said base via a connection member, and
the connection member moves said correction jig between a correction position located within an imaging range of said board recognizing camera, and a standby position located out of said imaging range.

2. The surface mounting apparatus according to claim 1, wherein
a height of said correction position is the same as a height of a board mark provided on said positioned board when an electronic component is mounted on said positioned board.

3. A surface mounting apparatus comprising:
a mounting head which is movable in X and Y directions and which mounts an electronic component on a positioned board; and
a board recognizing camera which is fixed to a base and which moves integrally with said mounting head, wherein
a correction jig is fixed to said base, the correction jig includes a correction mark which is imaged by said board recognizing camera and an imaging result is obtained, and
temporal change in an interior portion of said camera including an optical system is corrected based on the imaging result.

* * * * *